United States Patent [19]

Miyawaki et al.

[11] Patent Number: 4,644,184

[45] Date of Patent: Feb. 17, 1987

[54] MEMORY CLOCK PULSE GENERATING CIRCUIT WITH REDUCED PEAK CURRENT REQUIREMENTS

[75] Inventors: Naokazu Miyawaki; Mitsugi Ogura, both of Yokohama, Japan

[73] Assignee: Tokyo Shibaura Denki Kabushiki Kaisha, Kawasaki, Japan

[21] Appl. No.: 548,730

[22] Filed: Nov. 4, 1983

[30] Foreign Application Priority Data

Nov. 11, 1982 [JP] Japan .................... 57/198192

[51] Int. Cl.$^4$ ............... H03K 5/135; H03K 17/28; H03K 17/687; G11C 19/00
[52] U.S. Cl. .................... 307/269; 307/601; 307/603; 307/584; 307/578; 307/268; 307/262; 377/68
[58] Field of Search .......... 307/269, 450, 451, 453, 307/481, 241, 242, 571, 572, 584, 585, 597, 598, 601, 603, 605, 606, 262, 268, 255; 377/68

[56] References Cited

U.S. PATENT DOCUMENTS

| | | |
|---|---|---|
| 3,402,355 | 9/1968 | Hannan et al. ............... 307/606 X |
| 3,538,349 | 11/1970 | Smith ............................ 307/571 X |
| 3,588,527 | 6/1971 | Cricchi ......................... 377/68 X |
| 3,614,477 | 10/1971 | Liebman ....................... 307/572 X |
| 3,641,370 | 2/1972 | Heimbigner ................... 307/269 |
| 3,676,711 | 7/1972 | Ahrons ......................... 307/255 X |
| 3,946,255 | 3/1976 | Stein ............................ 307/269 |
| 3,969,706 | 7/1976 | Proebsting et al. ........... 307/480 X |
| 4,004,163 | 1/1977 | Spence ......................... 307/601 |
| 4,061,933 | 12/1977 | Schroeder et al. ............ 307/262 |
| 4,065,679 | 12/1977 | Heeren ......................... 307/584 |
| 4,181,861 | 1/1980 | Maehashi ...................... 377/79 |
| 4,401,904 | 8/1983 | White, Jr. et al. ............. 307/601 X |
| 4,496,861 | 1/1985 | Bazes ............................ 307/603 X |

OTHER PUBLICATIONS

Makoto Taniguchi et al., "Fully Boosted 64K Dynamic RAM with Automatic and Self-Refresh," *IEEE Journal of Solid-State Circuits*, vol. SC-16, No. 5, Oct. 1981.

*Primary Examiner*—Stanley D. Miller
*Assistant Examiner*—David R. Bertelson
*Attorney, Agent, or Firm*—Finnegan, Henderson, Farabow, Garrett & Dunner

[57] ABSTRACT

A dynamic type semiconductor memory device having refreshing function includes a clock pulse generating circuit having a row clock pulse generating section which includes a plurality of cascade-connected delay circuits, a plurality of MOS transistors selectively connected between said delay circuits, and a gate control circuit for changing conduction resistances of the MOS transistors according to the level of a refreshing signal.

1 Claim, 13 Drawing Figures

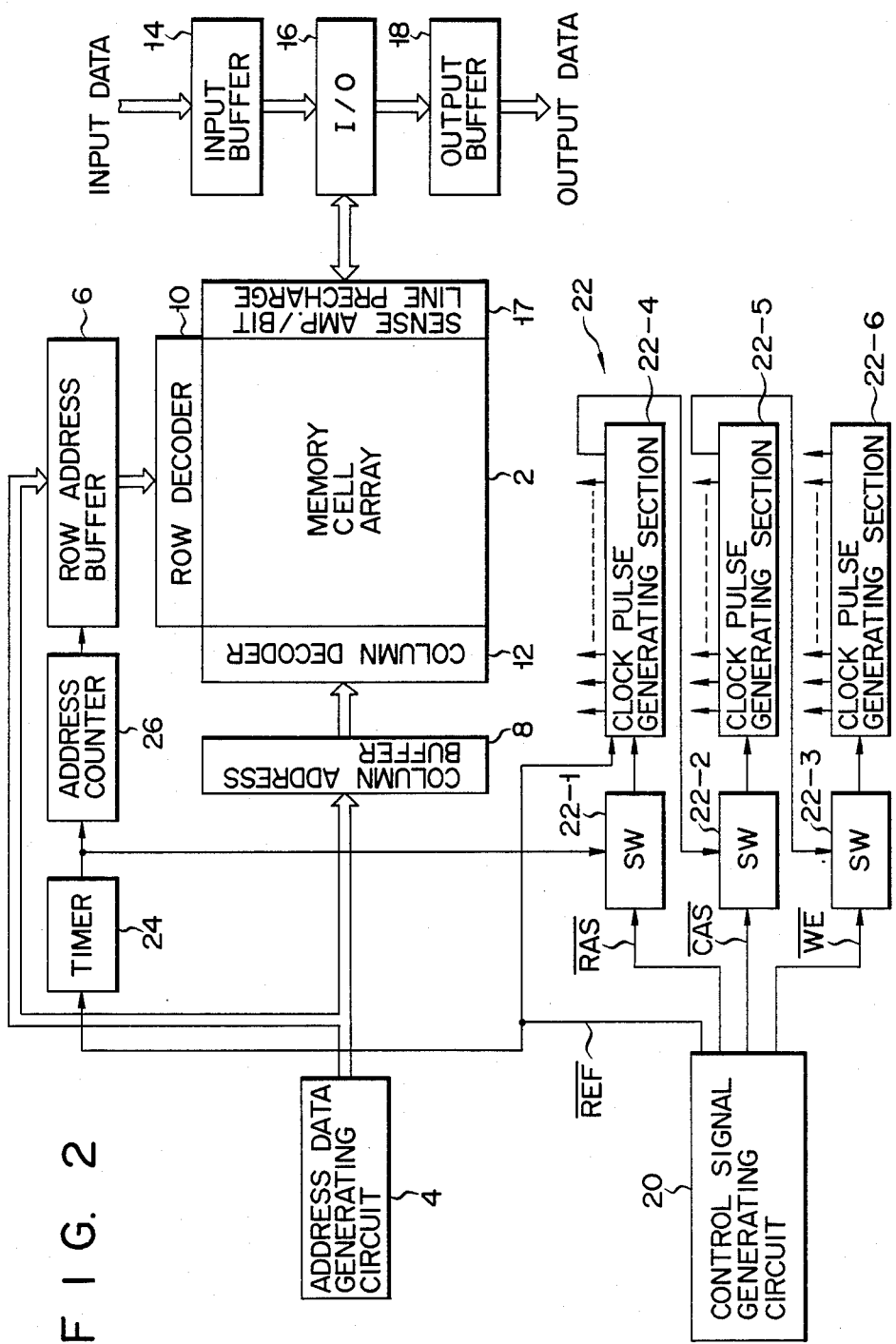
F I G. 2

F I G. 4A 
F I G. 4B 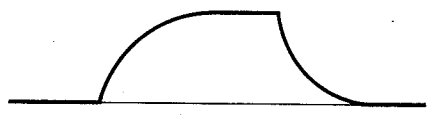
F I G. 4C 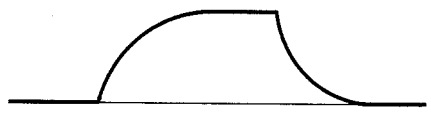
F I G. 4D 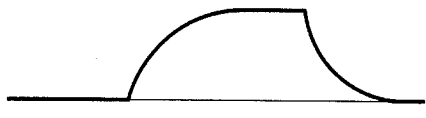
F I G. 5A 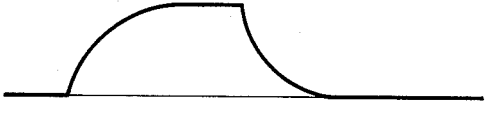
F I G. 5B 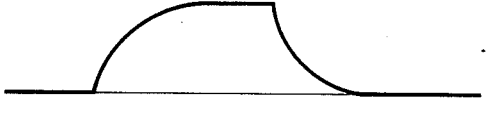
F I G. 5C 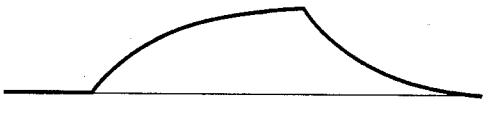
F I G. 5D 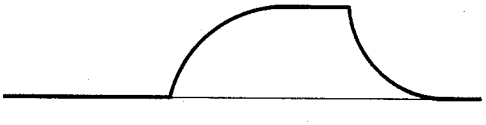

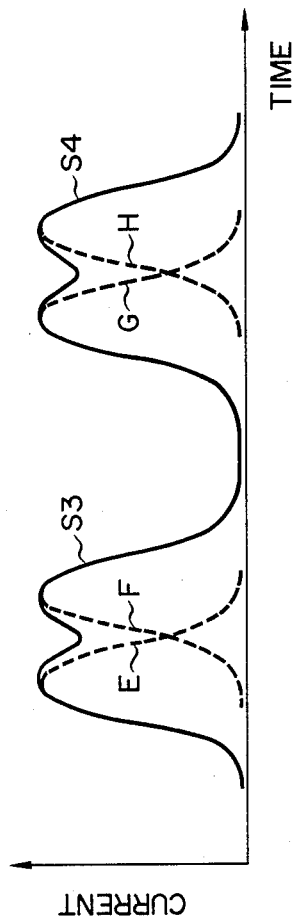
F I G. 6
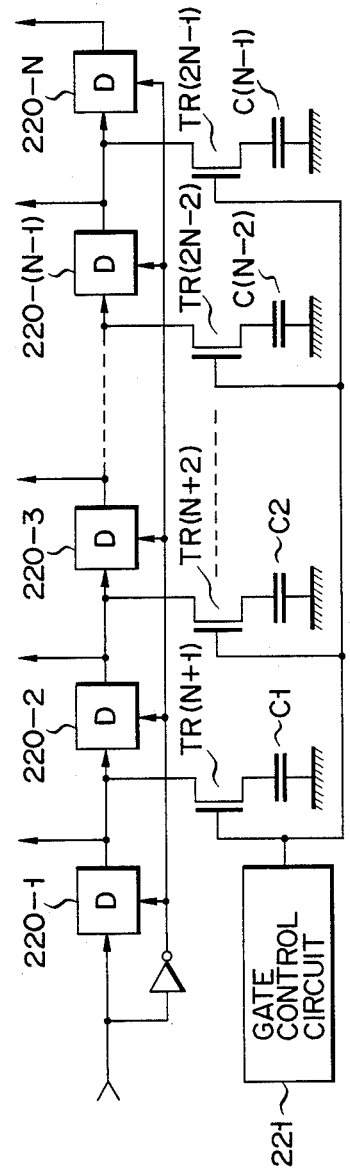
F I G. 7

4,644,184

MEMORY CLOCK PULSE GENERATING CIRCUIT WITH REDUCED PEAK CURRENT REQUIREMENTS

BACKGROUND OF THE INVENTION

The present invention relates to a dynamic type semiconductor memory device having refreshing function.

Dynamic random access memories (DRAM) developed these days have a self-refreshing function for the reasons that the construction of means arranged around the memory can be simplified and that battery back-up operation can be easily achieved at the time of power source accident. The self-refreshing function means that data stored in the memory is refreshed independently of external circuits of the memory when refreshing input signal $\overline{REF}$ is set low and row address strobe signal $\overline{RAS}$ is set high. This self-refreshing function is achieved by means of a timer circuit which is rendered operative, when refreshing input signal $\overline{REF}$ becomes low, to generate a pulse every lapse of a predetermined time period, and a counter circuit which counts pulses supplied from the timer circuit to generate a refreshing row address signal so as to refresh memory data in every row. When the DRAM is devised to have this self-refreshing function, the construction of battery back-up system can be simplified and memory data can also be held with reliability.

When the memory device of this type is to carry out the self-refreshing operation, clock pulses are continuously applied to a row address buffer and a row decoder through such a clock pulse generating circuit as disclosed by U.S. Pat. No. 3,969,706, for example, to perform an active cycle during which memory data in memory cells on a selected row are refreshed. Clock pulses are then applied to the row decoder and a sense amplifier/bit line precharge circuit to perform a precharge cycle during which the row decoder and the bit line are precharged. In case of carrying out the self-refreshing operation, the following currents are consumed in the memory device. That is, currents flowing through the clock pulse generating circuit and the row address buffer are superposed to make an operation current shown by a broken line A in FIG. 1, and a current resulting from the superposition of currents flowing through the clock pulse generating circuit and the row decoder and shown by a broken line B in FIG. 1 flows through a power source line (not shown) just after the current shown by the broken line A in FIG. 1 is flows. Finally, a total current shown by a solid line S1 in FIG. 1 flows through the power source line in the active cycle. On the other hand, currents flowing through the clock pulse generating circuit and the row decoder are superposed in the precharge cycle to make an operation current shown by a broken line C in FIG. 1, and a current resulting from the superposition of currents flowing through the clock pulse generating circuit and the sense amplifier/bit line precharge circuit and shown by a broken line D in FIG. 1 flows through the power source line just after the current shown by the broken line C in FIG. 1 flows. A total current shown by a solid line S2 flows through the power source line in the precharge cycle. When the self-refreshing operation is achieved by the DRAM having 64k bits, for example, peak value of the total currents S1 and S2 is about 60 mA.

In the case of the memory device provided with 128 units of the 64-Kbit DRAMs and having a memory capacity of 1M byte, for example, the 128-unit DRAMs are made operative substantially synchronizingly and a current having a peak value of 60 mA×128≈7.7A therefore flows through the power source line when the self-refreshing operation is carried out by the back-up battery at the time of power source accident. Since a large current like this flows through the power source line, the back-up battery employed must be of large capacity. When the battery employed is of small capacity, the power source voltage greatly fluctuates at the time when a large current flows through the power source line, possibly preventing the memory device from carrying out normal operation and from holding memory data.

SUMMARY OF THE INVENTION

The object of the present invention is to provide a semiconductor memory device of the dynamic type capable of minimizing the peak value of current flowing through the power source line and of reliably holding memory data at the time of refreshing operation.

This object can be achieved by a dynamic type semiconductor memory device including a clock pulse generating section for supplying clock pulses to a row address buffer circuit and a row decoder circuit which includes a plurality of cascade-connected delay circuits, at least one delay element selectively connected to one of the output terminals of these delay circuits and whose delay amount is variable, and a control circuit for increasing the delay amount of said delay element in an auto/self refreshing mode.

According to the present invention, clock pulses are supplied to the row address buffer circuit and the row decoder circuit with a longer delayed time, when memory data stored in the memory device are refreshed at the time of power source accident, and the peaks of operation currents flowing through the power source line when the row address buffer circuit and row decoder circuit are rendered operative are generated with the longer delayed time. Therefore, even if these operation currents are superposed one upon the other, the peak value of the superposed current will not become large, thus preventing fluctuation of the power source voltage by this operation current.

BRIEF DESCRIPTION OF THE DRAWINGS

FIG. 2 is a block diagram showing an example of dynamic type semiconductor memory device according to the present invention;

FIG. 4A to 4D are signal waveforms intended for illustrating the operation of the clock pulse generating section of FIG. 3 when the power source is performing normal operation, that is, the self-refreshing operation is not performed;

FIGS. 5A to 5D are signal waveforms intended for illustrating the operation of the clock pulse generating section of FIG. 3 at the time of power source accident, that is, under self-refreshing mode;

FIG. 6 shows waveforms of operation currents flowing through the power source line at the time of power source accident, that is, under self-refreshing mode; and FIG. 7 shows a modification of the clock pulse generating section shown in FIG. 3.

DETAILED DESCRIPTION OF THE PREFERRED EMBODIMENTS

Figure 1:
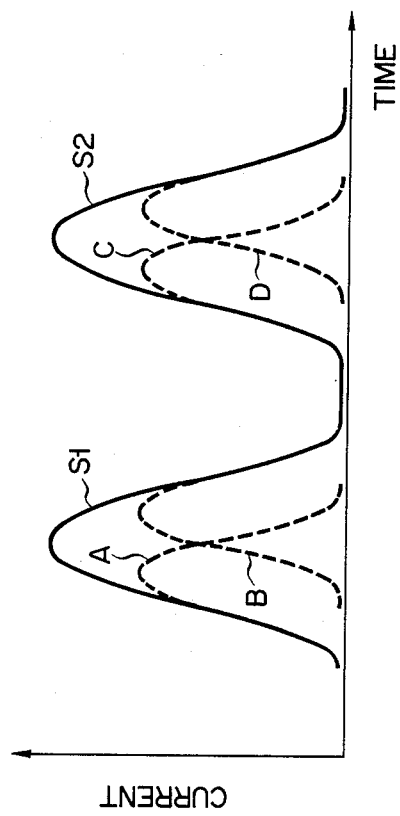
FIG. 1 shows waveforms of operation currents under self-refreshing mode in the case of the conventional dynamic type semiconductor memory device.

FIG. 2 is a general block diagram showing an example of dynamic type semiconductor memory device according to the present invention and having self-refreshing function. The memory device includes a memory cell array 2, row and column address buffers 6 and 8 for temporarily storing row and column address data, respectively, supplied from an address data generating circuit 4 (external circuit), and row and column decoders 10 and 12 for designating the row and the column of the memory cell array 2 in response to row and column address data supplied from the row and column address buffers 6 and 8. Data generated from an external circuit (not shown) is supplied to the memory cell array 2 through an input buffer 14, an I/O unit 16 and a sense amplifier/bit line precharge circuit 17, while data from the memory cell array 2 is transmitted to an external circuit through the sense amplifier/bit line precharge circuit 17, I/O unit 16 and an output buffer 18.

The memory device is connected to a control signal generating circuit 20 (external circuit) for generating row address strobe signal $\overline{RAS}$, column address strobe signal $\overline{CAS}$, write enable signal $\overline{WE}$, and refreshing signal $\overline{REF}$, these signals being changed in level in response to operation mode, and a clock pulse generating circuit 22 for generating clock pulses, which serve as timing signals, responsive to output signals from the control signal generating circuit 20. In the case of this memory device, self-refreshing function is achieved by means of a timer circuit 24 which generates a timing pulse at a predetermined time interval in response to a low level reference signal $\overline{REF}$ from the control signal generating circuit 20, and an address counter 26 which counts timing pulses from the timer circuit 24 to supply its counting data as address data to the row address buffer 6.

The clock pulse generating circuit 22 includes switching circuits 22-1 to 22-3, the switching circuit 22-1 being set conductive by a low level output signal from the timer circuit 24, and clock pulse generating sections 22-4 to 22-6 which generate pulses responsive to row address strobe signal $\overline{RAS}$, column address strobe signal $\overline{CAS}$ and write enable signal $\overline{WE}$ supplied, respectively, through the switching circuits 22-1 to 22-3. The switching circuit 22-1 is put on when the power source is under normal condition, but on and off responsive to timing pulse applied from the timer circuit 24 at the time of power source accident. The switching circuits 22-2 and 22-3 are turned on responsive to predetermined clock pulses supplied, respectively, from the clock pulse generating sections 22-4 and 22-5 so as to define the operation sequence of the clock pulse generating sections 22-4 to 22-6.

Pulses are supplied from the clock pulse generating circuit 22 to the row and column address buffers 6, 8, row and column decoders 10, 12, input and output buffers 14, 18, I/O unit 16 and sense amplifier/bit line precharge circuit 17 at predetermined timings so as to control operating timings of these circuit units. The circuit units shown in FIG. 2 are all connected to the common power source (not shown) through the power source line.

Figure 3:
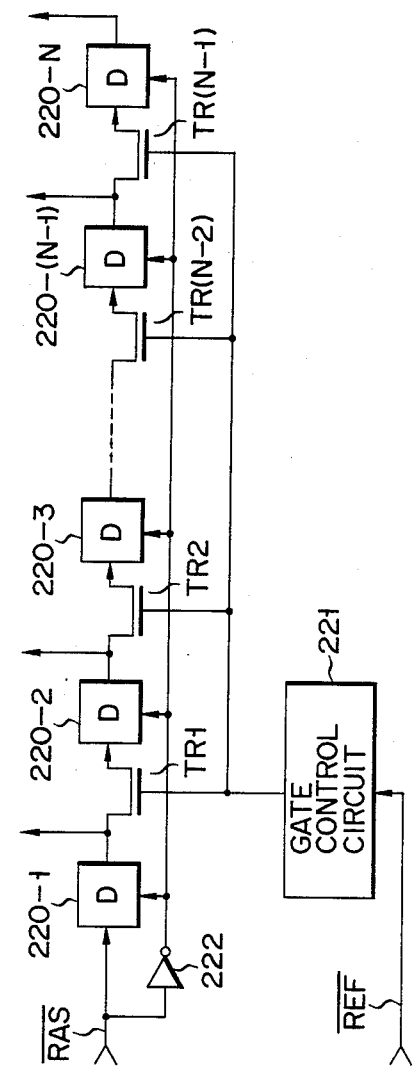
FIG. 3 is a circuit diagram showing in detail the clock pulse generating section of FIG. 2.

FIG. 3 is a block diagram showing the clock pulse generating section 22-4 in the clock pulse generating circuit 22 shown in FIG. 2. The clock pulse generating section 22-4 includes a plurality of clock generators or delay stages 220-1 to 220-N, MOS transistors TR1 to TR(N-1) each connected between the two successive delay stages, and a gate control circuit 221 for supplying gate voltage to these MOS transistors TR1 to TR(N-1). Row address strobe signal $\overline{RAS}$ is supplied to the input terminal of the first delay stage 220-1 and also supplied, as precharge signal, to each of the delay stages 220-1 to 220-N through an inverter 222. As disclosed by U.S. Pat. Nos. 3,969,706 and 4,061,933, for example, the delay stages 220-1 to 220-N are each constituted by a plurality of MOS transistors to delay an input signal by a predetermined time period to generate an output signal which has power source voltage and ground potential levels.

Responsive to a refreshing signal of high level or power source voltage level, for example, the gate control circuit 221 supplies a gate voltage VG1 to gates of these MOS transistors TR1 to TR(N-1), the gate voltage VG1 serving to make the transconductance gm of the MOS transistors TR1 to TR(N-1) sufficiently large. Responsive to a refreshing signal of low level or ground potential level, for example, the gate control circuit 221 also supplies a gate voltage VG2, which serves to make transconductance gm of the MOS transistors TR1 to TR(N-1) small, to gates of these MOS transistors TR1 to TR(N-1).

When the power source is under normal operation in the case of the memory device shown in FIGS. 2 and 3, a high level refreshing signal REF is generated from the control signal generating circuit 20, whereby the timer circuit 24 is held nonoperative, and the gate voltage VG1 is generated from the gate control circuit 221 to make the MOS transistors TR1 to TR(N-1) conductive completely. Under this state, therefore, the row clock pulse generating section 22-4 performs substantiallly the same operation as the row clock generator as is disclosed in U.S. Pat. No. 3,969,706. More specifically, when a signal shown in FIG. 4A is supplied to the delay stage 220-1, a signal shown in FIG. 4B having a predetermined delay time DT is generated from this delay stage 220-1. An output signal of this delay stage 220-1 is not delayed but supplied, as an input signal shown in FIG. 4C to the next delay stage 220-2 via the MOS transistor TR1. The delay stage 220-2 generates an output signal which is shown in FIG. 4D and which has been delayed by the predetermined time DT from its input signal. Output signals from the delay stages in the row clock pulse generating section 22-4 are thus used as row control pulses.

As already described above referring to FIG. 1, an operation current having a large peak value flows in this case through the power source line at the time of refreshing operation, but driving capacity of the main power source is so large as to leave the power source voltage un-fluctuated. Therefore, no problem occurs.

It is assumed that the main power source is damaged, that the backup battery is therefore used, and that a refreshing signal $\overline{REF}$ of low level or 0 V and a row address strobe signal $\overline{RAS}$ of high level or 5 V are generated from the control signal generating circuit 20. In this condition, the timer circuit 24 generates an output signal which is periodically set at a high level, whereby rows in the memory cell array are successively selected while a row address strobe signal $\overline{RAS}$ of high level is intermittently supplied to the row clock pulse generating section 22-4 through the switching circuit 22-1. Responsive to the refreshing signal $\overline{REF}$ of low level, the gate control circuit 221 generates the gate voltage VG2 to set transconductance gm of the MOS transistors TR1 to TR(N-1) to a small value, whereby a delay circuit is formed by resistance of the MOS transistor, line resistance, floating capacitance associated with the source and drain of the MOS transistor, and the gate capacitance of an input MOS transistor at the next delay stage. When a signal shown in FIG. 5A, for example, is supplied to the delay stage 220-1, an output signal shown in FIG. 5B is generated from the delay stage 220-1 after lapse of the predetermined delay time DT. This output signal of the delay stage 220-1 is further delayed, as shown in FIG. 5C, by the delay circuit which is formed, as described above, by the MOS transistor TR1, floating capacitance and the like and then supplied to the next delay stage 220-2, which delays this input signal by the predetermined time DT and then generates an output signal shown in FIG. 5D.

When the transconductance gm of the MOS transistors TR1 to TR(N-1) is set to a small value as described above, an output pulse from each of the delay stages in the row clock pulse generating section 22 is delayed by a longer time period and then supplied to the next delay stage. When the self-refreshing. operation is performed under this state, currents flowing through the clock pulse generating circuit 22 and the row address buffer 6 are superposed at first to cause a current which is shown by a broken line E in FIG. 6 to flow through the power source line. After a short time interval, a current resulting from superposition of currents flowing through the clock pulse generating circuit 22 and the row decoder 10 and shown by a broken line E in FIG. 6 is flowed through the power source line. This is the process in the active cycle of this memory device. Similarly in the precharge cycle, currents flowing through the clock pulse generating circuit 22 and the row decoder 10 are superposed to cause a current which is shown by a broken line G in FIG. 6 to flow through the power source line, and after a short time interval, a current resulting from superposition of currents flowing through the clock pulse generating circuit 22 and the sense amplifier/bit line precharge circuit 17 and shown by a broken line H in FIG. 6 flows through the power source line. Accordingly, total currents shown by solid lines S3 and S4 in FIG. 6 flows through the power source line both in the active and precharge cycles.

What is to be noted here is that since a current F begins to flow after lapse of a longer time from when a current E starts flowing than in the case described above referring to FIG. 1, the peak value of the total current S3 becomes substantially equal to that of each of currents E and F. This can also be said similarly to the total current S4. Namely, the total currents S3 and S4 are adapted to have peak values much smaller, as shown in FIG. 6, than those of total currents S1 and S2 shown in FIG. 1, and even if these total currents S3 and S4 flows through the power source line, therefore, no big fluctuation is caused in power source voltage of the backup battery.

Although the present invention has been described with reference to one embodiment thereof, it should be understood that the present invention is not limited to this embodiment. Each of the MOS transistors TR1 to TR(N-1) has been connected between the two successive delay stages in FIG. 3, for example, but some of these MOS transistors TR1 to TR(N-1) may be selectively removed.

Although the embodiment of the present invention has been described as the memory device having self-refreshing function, the present invention can also be applied to the dynamic memory device having auto-refreshing function.

In addition, MOS transistors TR(N+1) to TR(2N-1) and capacitors C1 to C(N-1) connected in series to these MOS transistors as shown in FIG. 7 can be employed, instead of the MOS transistors TR1 to TR(N-1), to form the delay elements whose delay amounts are variable.

What is claimed is:
1. A .clock pulse generating circuit comprising:
input means for receiving a pulse signal;
a plurality of cascade-connected delay circuits each having an input terminal and and an output terminal, a first one of said delay circuits being connected to said input means to receive the pulse signal, and each of said delay circuits delaying an input signal supplied thereto by a fixed delay amount without changing the waveshape of the input signal;
at least one delay element selectively connected to at least one output terminal of said delay circuits and whose delay amount is variable; and
a control circuit for selectively supplying first and second control signals to said at least one delay element so as to change the delay amount of said at least one delay element;
said delay element comprising a MOS transistor having a gate connected to said control circuit and a current path connected at one end to the output and input terminals of corresponding first and second delay circuits, respectively, said delay element further comprising a capacitive element connected between the other end of the current path of said MOS transistor and a reference potential terminal, said MOS transistor being rendered nonconductive in response to said second control signal.

* * * * *